(12) United States Patent
Han et al.

(10) Patent No.: US 10,486,627 B2
(45) Date of Patent: Nov. 26, 2019

(54) VEHICLE, CONTROL METHOD THEREOF, AND POWER CONTROL APPARATUS FOR VEHICLE

(71) Applicant: Hyundai Motor Company, Seoul (KR)

(72) Inventors: SangJae Han, Whasung-Si (KR); Jin Kim, Whasung-Si (KR); HyoGeun Kwak, Whasung-Si (KR); Young Su Kim, Whasung-Si (KR); ChulMin Kim, Whasung-Si (KR)

(73) Assignee: Hyundai Motor Company, Seoul (KR)

( * ) Notice: Subject to any disclaimer, the term of this patent is extended or adjusted under 35 U.S.C. 154(b) by 110 days.

(21) Appl. No.: 15/488,796

(22) Filed: Apr. 17, 2017

(65) Prior Publication Data

US 2018/0022299 A1 Jan. 25, 2018

(30) Foreign Application Priority Data

Jul. 19, 2016 (KR) .......................... 10-2016-0091254

(51) Int. Cl.
| | |
|---|---|
| *B60R 16/033* | (2006.01) |
| *G01R 31/371* | (2019.01) |
| *G01R 31/387* | (2019.01) |
| *B60R 16/023* | (2006.01) |
| *G01C 21/36* | (2006.01) |

(52) U.S. Cl.
CPC ........ *B60R 16/033* (2013.01); *B60R 16/0231* (2013.01); *G01R 31/371* (2019.01); *G01R 31/387* (2019.01); *G01C 21/3676* (2013.01)

(58) Field of Classification Search
CPC .............. B60R 16/033; B60R 16/0231; G01R 31/3634; G01R 31/3689; G01C 21/3676
See application file for complete search history.

(56) References Cited

U.S. PATENT DOCUMENTS

| | | | |
|---|---|---|---|
| 7,768,384 B2 | 8/2010 | Yamaguchi | |
| 8,392,050 B2 | 3/2013 | Arai et al. | |
| 9,393,920 B2* | 7/2016 | Hosey | ..................... B60R 16/03 |
| 2008/0246488 A1* | 10/2008 | Bosse | .............. G01R 19/16542 |
| | | | 324/426 |
| 2009/0224869 A1* | 9/2009 | Baker | .................... G07C 5/008 |
| | | | 340/5.1 |
| 2015/0191162 A1* | 7/2015 | Dao | ......................... H04Q 9/00 |
| | | | 701/22 |
| 2016/0311385 A1* | 10/2016 | Wojcik | .................... B60R 16/03 |
| 2017/0141589 A1* | 5/2017 | Inoue | ........................ H02J 7/00 |
| 2017/0174157 A1* | 6/2017 | Deljevic | ................. B60L 58/12 |

FOREIGN PATENT DOCUMENTS

| | | | |
|---|---|---|---|
| JP | H 11-334498 A | 12/1999 | |
| JP | 2006-327487 A | 12/2006 | |

* cited by examiner

*Primary Examiner* — Ramsey Refai
(74) *Attorney, Agent, or Firm* — Morgan, Lewis & Bockius LLP

(57) ABSTRACT

A vehicle may include a battery configured to store electric energy, a plurality of electronic components configured to consume the electric energy, and a power control apparatus configured to block sequentially power supplied from the battery to the plurality of electronic components, during a vehicle is parked, wherein the power control apparatus may adjust a plurality of power off times configured to block the power supplied to the plurality of electronic components, based on state information of the battery.

15 Claims, 9 Drawing Sheets

VEHICLE, CONTROL METHOD THEREOF, AND POWER CONTROL APPARATUS FOR VEHICLE

CROSS-REFERENCE TO RELATED APPLICATION(S)

The present application claims priority to Korean Patent Application No. 10-2016-0091254, filed on Jul. 19, 2016, the entire contents of which is incorporated herein for all purposes by this reference.

BACKGROUND OF THE INVENTION

Field of the Invention

Exemplary Embodiments of the present invention relate to a vehicle, a control method thereof and a power control apparatus for vehicle, and more particularly to a vehicle, a control method of the vehicle and a power control apparatus for vehicle for controlling dark current according to a capacity of a battery.

Description of Related Art

A vehicle represents transportation means for driving on the road and railway using fossil fuels and electricity as a power source.

The vehicle may use the electric energy for the ignition and driving, and includes a battery for storing the electric energy.

The vehicle includes various electronics for securing the driver safety and providing the convenience to a driver. The electronics use the electric energy stored in the battery of the vehicle.

Although the number of electronics has been gradually increased in the vehicle, the number and the storage capacity of batteries are limited. Accordingly, the battery of the vehicle is frequently discharged during parking.

As a result, there is a great need to control the consumption of electric energy in the vehicle.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to provide a vehicle, a control method thereof and a power control apparatus for vehicle that can prevent a deep discharge of a battery during parking of the vehicle and provides the convenience to a driver when starting the vehicle.

Another aspect of the present invention is directed to provide a vehicle, a control method thereof and a power control apparatus for vehicle that can secure an ignition of the vehicle for a predetermined target ignition duration during the parking of the vehicle, and allow electronic components of the vehicle to be operated although a driver starts the ignition before the target ignition duration is expired.

Additional aspects of the present invention will be set forth in part in the description which follows and, in part, will be obvious from the description, or may be learned by practice of the present invention.

In accordance with an aspect of the present invention, a vehicle may include a battery configured to store electric energy, a plurality of electronic components configured to consume the electric energy, and a power control apparatus configured to block sequentially power supplied from the battery to the plurality of electronic components, while a vehicle is parked. The power control apparatus may adjust a plurality of power off times configured to block the power supplied to the plurality of electronic components, based on state information of the battery.

The battery may include a battery state detector configured to detect a rated capacity and a state of charge of the battery and to transmit the state information of the battery including the rated capacity and the state of charge of the battery, to the power control apparatus The power control apparatus may determine an amount of charge of the battery based on the rated capacity and the state of charge of the battery, and adjust the plurality of power off times based on the amount of charge of the battery.

The power control apparatus may determine the size of the dark current output from the battery while sequentially blocking the power supplied to the plurality of electronic components.

The power control apparatus may determine a maximum ignition duration based on the amount of charge of the battery, the size of the dark current and the plurality of power off times, and adjust the plurality of power off times based on a result of a comparison between the maximum ignition duration and a predetermined target ignition duration.

The power control apparatus may reduce the plurality of power off times when the maximum ignition duration is less than the predetermined target ignition duration.

The power control apparatus may increase the plurality of power off times when the maximum ignition duration is larger than the predetermined target ignition duration.

The battery may include a battery state detector configured to detect a state of charge of the battery and to transmit the state information of the battery including the state of charge of the battery, to the power control apparatus.

The power control apparatus may determine a rate of change of the state of charge of the battery while sequentially blocking the power supplied to the plurality of electronic components.

The power control apparatus may determine a maximum ignition duration based on the state of charge of the battery, the rate of change of the state of charge of the battery and the plurality of power off times, and adjust the plurality of power off times based on a result of a comparison between the maximum ignition duration and a predetermined target ignition duration.

In accordance with one aspect of the present invention, a control method of vehicle may include detecting a rated capacity and a state of charge of a battery for vehicle when a vehicle is parked, determining an amount of charge of the battery based on the rated capacity and the state of charge of the battery, and adjusting a plurality of power off times configured to block the power supplied to a plurality of electronic components included in the vehicle, based on the amount of charge of the battery.

The control method may further include determining the size of the dark current output from the battery while sequentially blocking the power supplied to the plurality of electronic components.

The adjustment of the plurality of power off times may include determining a maximum ignition duration based on the amount of charge of the battery, the size of the dark current and the plurality of power off times, and adjusting the plurality of power off times based on a result of a comparison between the maximum ignition duration and a predetermined target ignition duration.

The adjustment of the plurality of power off times based on the result of the comparison between the maximum ignition duration and the predetermined target ignition duration may include reducing the plurality of power off times when the maximum ignition duration is less than the predetermined target ignition duration.

The adjustment of the plurality of power off times based on the result of the comparison between the maximum ignition duration and the predetermined target ignition duration may include increasing the plurality of power off times when the maximum ignition duration is larger than the predetermined target ignition duration.

In accordance with an aspect of the present invention, a power control apparatus may include a plurality of switches configured to control power supplied from a battery to a plurality of electronic components, and a controller configured to control the plurality of switches so that the plurality of switches sequentially blocks the power supplied to the plurality of electronic components, while a vehicle is parked. The controller may adjust a plurality of power off times configured to block the power supplied to the plurality of electronic components, based on a rated capacity and a state of charge of the battery.

The controller may determine an amount of charge of the battery based on the rated capacity and the state of charge of the battery, and determines the size of the dark current output from the battery while sequentially blocking the power supplied to the plurality of electronic components.

The controller may determine a maximum ignition duration based on the amount of charge of the battery, the size of the dark current and the plurality of power off times, and adjusts the plurality of power off times based on a result of a comparison between the maximum ignition duration and a predetermined target ignition duration.

The controller may reduce the plurality of power off times when the maximum ignition duration is less than the predetermined target ignition duration.

The controller may increase the plurality of power off times when the maximum ignition duration is larger than the predetermined target ignition duration.

The methods and apparatuses of the present invention have other features and advantages which will be apparent from or are set forth in more detail in the accompanying drawings, which are incorporated herein, and the following Detailed Description, which together server to explain certain principles of the present invention.

Figure 1:
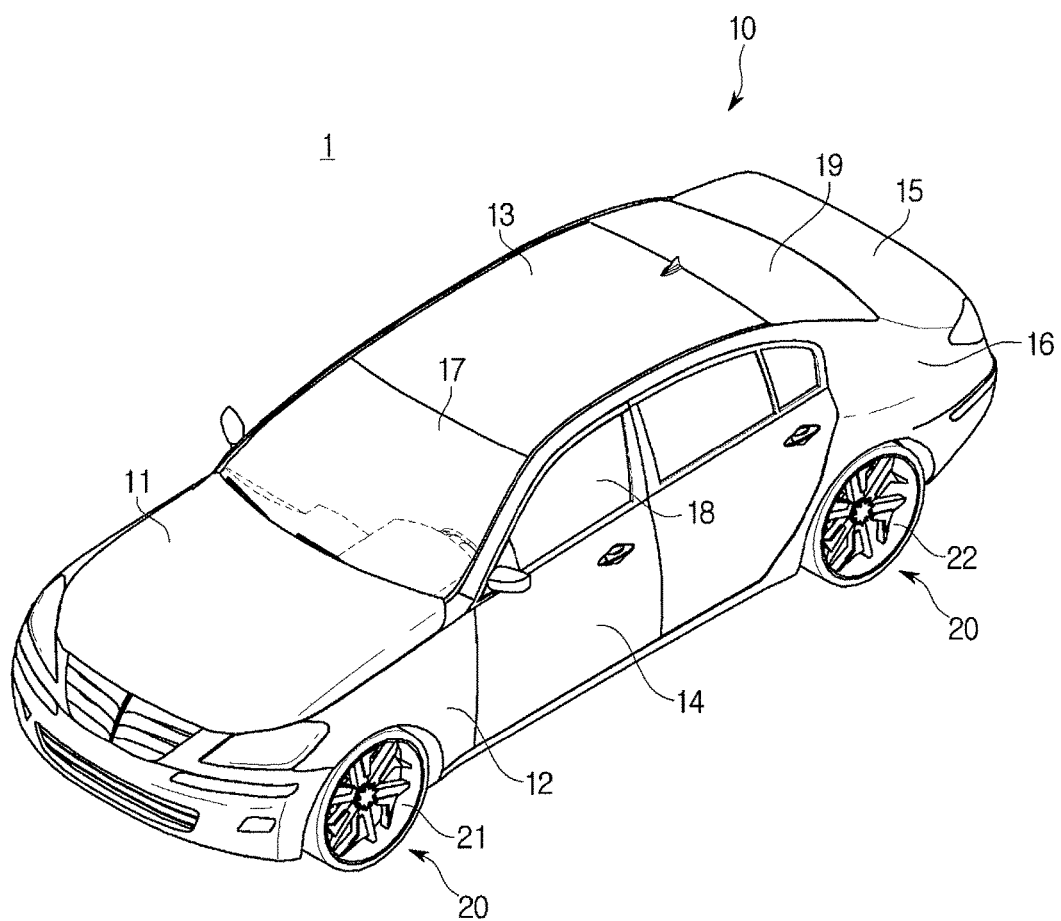
FIG. 1 is a view illustrating an outside of a vehicle in accordance with an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents, and other embodiments, which may be included within the spirit and scope of the invention as defined by the appended claims.

The progression of processing operations described is an example; however, the sequence of and/or operations is not limited to that set forth herein and may be changed as is known in the art, with the exception of operations necessarily occurring in a particular order. In addition, respective descriptions of well-known functions and constructions may be omitted for increased clarity and conciseness.

It will be understood that, although the terms first, second, etc. may be used herein to describe various elements, these elements should not be limited by these terms. These terms are only used to distinguish one element from another. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present.

The terminology used herein is for the purpose of describing particular embodiments only and is not intended to be limiting. As used herein, the singular forms "a," "an," and "the," are intended to include the plural forms as well, unless the context clearly indicates otherwise.

Figure 2:
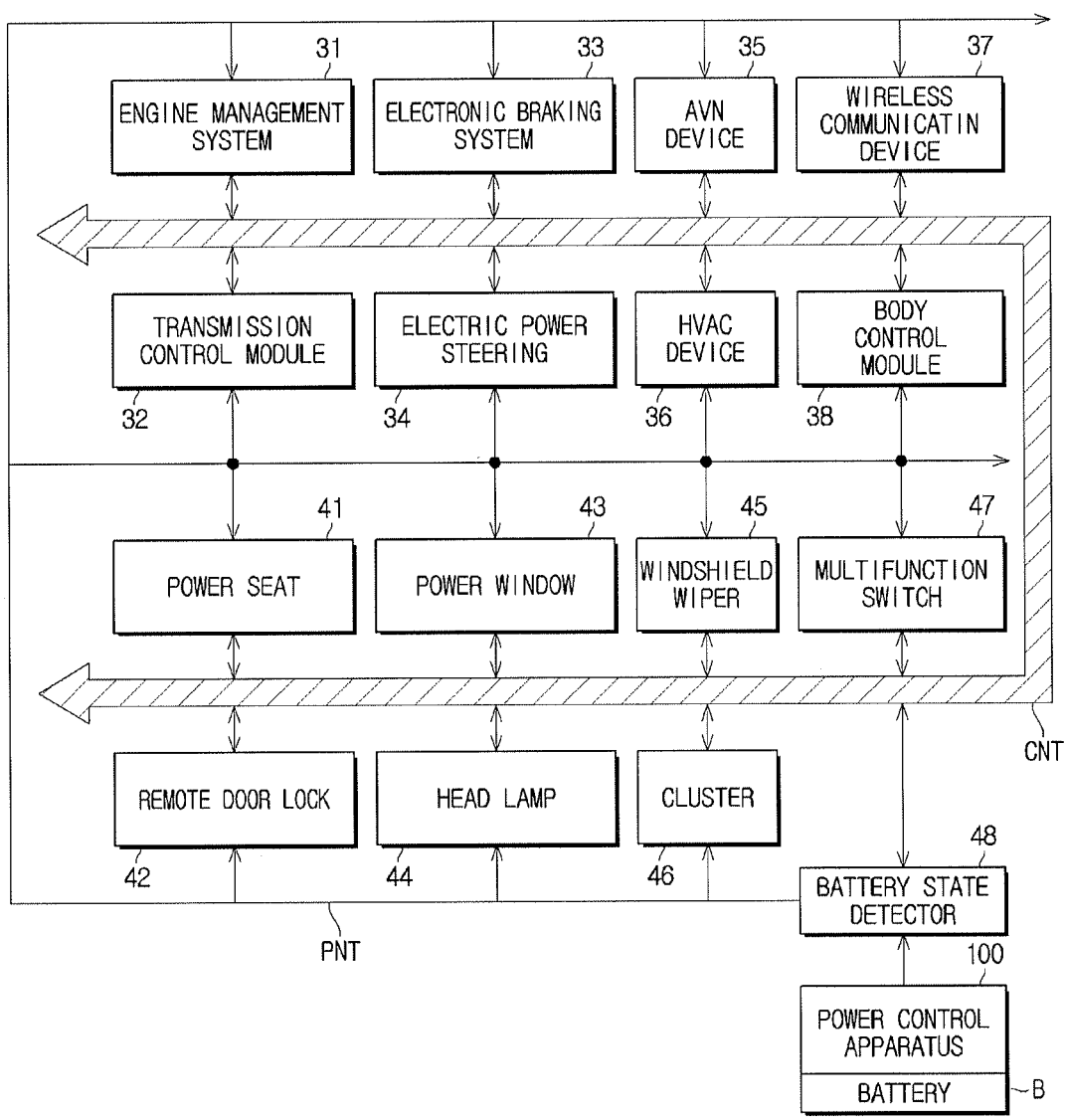
FIG. 2 is a view illustrating an electronic component of the vehicle in accordance with an exemplary embodiment of the present invention.

FIG. 1 is a view illustrating an outside of a vehicle in accordance with an exemplary embodiment of the present invention and FIG. 2 is a view illustrating an electronic component of the vehicle in accordance with an exemplary embodiment of the present invention.

As illustrated in FIG. 1, a vehicle 1 may include a body 10 forming an outside of the vehicle 1 and accommodating a variety of components, and vehicle wheels 20 moving the vehicle 1.

The body 10 may include a hood 11, a front fender 12, a roof panel 13, a door 14, a trunk lid 15 and a quarter panel 16 to form an internal compartment in which a driver is stayed. To provide a view to a driver, a front window 17 may be disposed in the front side of the body 10 and a side window 18 may be disposed in the lateral side of the body 10. Further, a rear window 19 may be disposed in the rear side of the body 10.

For the drive of the vehicle 1, a power system; a power train; a steering system; and a brake system may be provided in the internal of the body 10. The power system may be configured to generate a torque of the vehicle wheel 20 and include an engine, a fuel device, a cooling device, an exhaust system, and an ignition system. The power train may be configured to transmit the torque generated by the power system to the vehicle wheel 20 and include a clutch, a gear lever, a transmission, a differential device and a drive shaft. The steering system may be configured to change a driving direction of the vehicle 1 and include a steering wheel; a steering gear; and a steering link. In addition, the brake system may be configured to stop a driving of the vehicle 1 by stopping the rotation of the vehicle wheel 20 and include a brake pedal; a master cylinder; a brake disk; and a brake pad.

The vehicle wheel 20 may include a front wheel 21 provided in the front side of the vehicle, and a rear wheel 22 provided in the rear side of the vehicle, wherein the vehicle 1 may be moved back and forth by the rotation of the vehicle wheel 20.

For the control of the vehicle 1 and the safety and convenience of the occupant and the driver, the vehicle 1 may include a variety of electronic components 30, as well as the above mentioned mechanical devices.

As illustrated in FIG. 2, the vehicle 1 may include an engine management system (EMS) 31, a transmission control module (TCM) 32, an electronic braking system (EBS) 33, an electric power steering (EPS) device 34, an Audio/Video/Navigation (AVN) device 35, a heating/ventilation/air conditioning (HVAC) device 36, a wireless communication device 37, and a body control module (BCM) 38. The vehicle 1 may further include a power seat 41, a remote door lock 42, a power window 43, a head lamp 44, a windshield wiper 45, a cluster 46, a multifunction switch 47 and a power control apparatus 100.

The engine management system (EMS) 31 may control an operation of the engine and manage the engine. For example, the engine management system (EMS) 31 may perform an engine torque control, a fuel control, and an engine failure diagnosis.

The transmission control module (TCM) 32 may control an operation of a transmission. For example, the transmission control module (TCM) 32 may perform a transmission control, a damper clutch control, a pressure control when a friction clutch is turned on or off, and an engine torque control during shifting.

The electronic braking system (EBS) 33 may control a braking system of the vehicle 1 and maintain a balance of the vehicle 1. For example the electronic braking system (EBS) 33 may include an Anti-lock Brake System (ABS) and an Electric Stability Control (ESC).

The electric power steering (EPS) device 34 may assist a driver so that the driver easily operates a steering wheel. The electric power steering (EPS) device 34 may assist a driver's steering operation by reducing a steering force during driving at a low-speed or parking, and by increasing the steering force during driving at high-speed.

In response to a user's input, the Audio/Video/Navigation (AVN) device 35 may output music or an image or display a route to a destination that is input by the driver.

The heating/ventilation/air conditioning (HVAC) device 36 may introduce air from the outside of the vehicle 1 into the internal of the vehicle 1 and circulate the air within the internal of the vehicle 1. The heating/ventilation/air conditioning (HVAC) device 36 may heat and cool the internal air according to an ambient temperature of the vehicle 1.

The wireless communication device 37 may communicate with another vehicle, a user's terminal or a communication relay device through a wireless communication technology. The wireless communication device 37 may be used for a vehicle to vehicle communication (V2V communication), a vehicle to infrastructure communication (V2I communication), a vehicle to nomadic devices communication (V2N communication), and a vehicle to grid communication (V2G communication). The wireless communication device 37 may include a Telematics Unit (TMU).

The body control module (BCM) 38 may control an operation of the electronic component 30 configured to provide the convenience to a driver or ensure the driver's safety. For example, the body control module (BCM) 38 may control the power seat 41, the remote door lock 42, the power window 43, the head lamp 44, the windshield wiper 45, the cluster 46 and the multifunction switch 47 described in the followings.

The power seat 41 may adjust a position of the seat on which a driver or an occupant is seated, and the remote door lock 42 may lock or unlock the door 14 of the vehicle. The power window 43 may move the side window 18 of the vehicle 1 up and down, and the head lamp 44 may irradiate the light toward the front side of the vehicle 1. The windshield wiper 45 may remove foreign materials attached to the front window 17 of the vehicle 1 and the cluster 46 may display information related to the driving of the vehicle 1. In addition, the multifunction switch 47 may receive a command related to turning on or off the head lamp 44 and an operation of the windshield wiper 45 from a driver.

The above described electronic components 30 may communicate with each other via the vehicle communication network (CNT). For example, the engine management system (EMS) 31, the transmission control module (TCM) 32, the electronic braking system (EBS) 33, the electric power steering (EPS) device 34, the Audio/Video/Navigation (AVN) device 35, the heating/ventilation/air conditioning (HVAC) device 36, the wireless communication device 37, the body control module (BCM) 38, the power seat 41, the remote door lock 42, the power window 43, the head lamp 44, the windshield wiper 45, the cluster 46, the multifunction switch 47 and the power control apparatus 100 may send and receive data via the vehicle communication network (CNT).

The vehicle communication network (CNT) may employ a communication protocol, e.g., Media Oriented Systems Transport (MOST), FlexRay, Controller Area Network (CAN), and Local Interconnect Network (LIN). In addition, the vehicle communication network (CNT) may employ a plurality of communication protocols as well as employing a single communication protocol, e.g., Media Oriented Systems Transport (MOST), FlexRay, Controller Area Network (CAN), and Local Interconnect Network (LIN).

The electronic component 30 may be supplied with electric energy from the battery (B) through a power network (PNT). The battery (B) may store the electric energy generated by the generator during the operation of the engine, and supply the electric energy to each of the electronic component 30 of the vehicle 1.

Further, a battery state detector 48 configured for acquiring a variety of information related to the battery (B) and outputting the acquired information may be disposed in the battery (B). For example, the battery state detector 48 may acquire battery state information, e.g., a rated capacity of the battery (B), State of Charge (SoC) of the battery (B), State of Health (SoH) of the battery (B), an output voltage (V) of the battery (B), an output current (I) of the battery (B), a temperature (t) of the battery (B), and Real Time clock (RTC) of the battery (B).

The electric energy supplied from the battery (B) to the electronic component 30 may be controlled by the power control apparatus 100. The power control apparatus 100 may receive the battery state information, e.g., the rated capacity, the state of charge (SoC), the state of health (SoH), the output voltage (V), the output current (I), the temperature (t) and the Real Time clock (RTC) of the battery (B). Further, the power control apparatus 100 may distribute the power to each of the electronic component 30 according to a driving state of the vehicle 1 and the battery state information.

The power control apparatus 100 may block the current supplied to the electronic component 30 according to the battery state information while the vehicle 1 is parked. When the vehicle 1 is parked, i.e., an ignition of the vehicle 1 is turned off, the power supplied to some of electronic components may be blocked while some of electronic components receives the power from the battery (B) for an operation thereof. For example, the engine management system (EMS) 31, the Audio/Video/Navigation (AVN) device 35, the heating/ventilation/air conditioning (HVAC) device 36, and the body control module (BCM) 38, the remote door lock 42 may receive the power from the battery (B) and continue an operation thereof.

For the ignition of the vehicle 1, the power control apparatus 100 may block the power of the electronic component 30 which continues the operation thereof when the vehicle 1 is parked. For example, when the electronic component 30 runs out of the electric energy stored in the battery (B) while the vehicle 1 is parked, it may be impossible to start the vehicle 1. Therefore, while the vehicle 1 is parked, the power control apparatus 48 may appropriately block the power supplied to the electronic component 30 for the ignition of the vehicle 1.

A configuration and function of the power control apparatus 100 will be described in details in the following.

The above described electronic component 30 is merely an example of an electronic component disposed in the vehicle 1. In the vehicle 1, an electronic component having a different name from the above described electronic component 30 may be disposed or an additional electronic component besides the above described electronic component 30 may be disposed. In addition, some of the above described electronic component 30 may be omitted.

Hereinafter a configuration and function of the above described power control apparatus 100 will be described in details.

Figure 3:
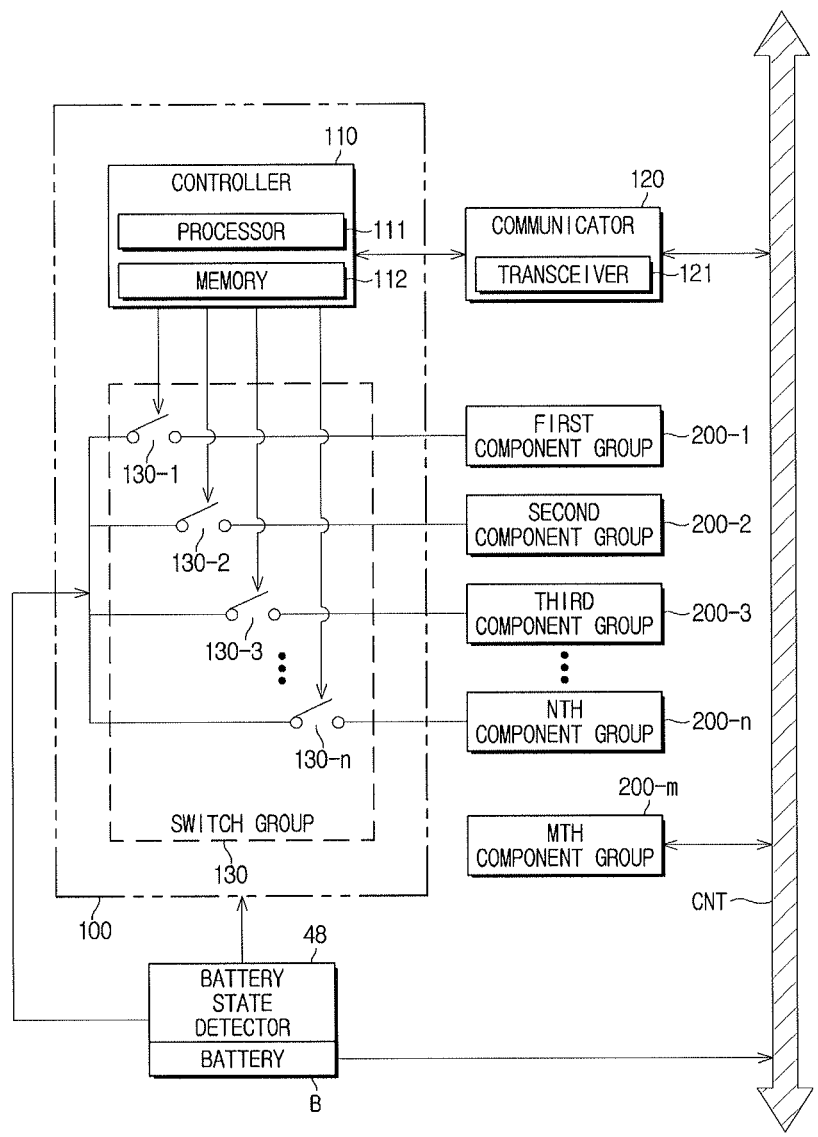
FIG. 3 is a view illustrating the power control apparatus in accordance with an exemplary embodiment of the present invention.

FIG. 3 is a view illustrating the power control apparatus in accordance with an exemplary embodiment of the present invention.

Prior to the description of the power control apparatus 100, electronic component groups 200; 200-1, 200-2, 200-3, . . . 200-*n*, 200-*m*, including at least one electronic component 30 will be described first.

A plurality of electronic components 30 may be classified into a plurality of electronic component groups 200 according to a variety of standards. In other words, each of the electronic component group 200 may include at least one electronic component 30.

The plurality of electronic components 30 may be classified as an electronic component related to the driving of the vehicle 1, an electronic component for securing the driver safety, an electronic component for providing a convenience to a driver, or an electronic component related to the security of the vehicle 1. For example, the power seat 41 and the power window 43 may be included in a first electronic component group 200-1, and the Audio/Video/Navigation (AVN) device 35, the heating/ventilation/air conditioning (HVAC) device 36, and the wireless communication device 37 may be included in a second electronic component group 200-2. The electronic component providing the convenience related to the driving of the vehicle 1, e.g., the transmission control module (TCM) 32, the electronic braking system (EBS) 33, and the electric power steering (EPS) device 34 may be included in a third electronic component group 200-3, and the engine management system (EMS) 31 may be included in a fourth electronic component group 200-4. In addition, the remote door lock 42 may be included in a nth electronic component group 200-*n*. However, the electronic component group 200 may be merely an example, and it does not exclude that the plurality of electric components 30 is classified into the plurality of electronic component groups 200 by using another method.

Some of the plurality of electronic component groups 200 may receive or not receive the power by the power control apparatus 100 described in the following. When the power is blocked by the power control apparatus 100, an operation of the electronic component 30 included in the electronic component group 200 may be stopped.

Some of the plurality of electronic component groups 200 may receive a power save mode command via the vehicle communication network (CNT), and in response to the received power save mode command, the electronic component 30 included in the electronic component group 200 may be operated in the power save mode configured to minimize the consumption of the power.

The power control apparatus 100 will be described in the following.

The power control apparatus 100 may include a switch group 130 supplying or blocking the electric energy of the battery (B) to the electronic component 30, a communicator 120 configured for sending and receiving data via the vehicle communication network (CNT), and a controller 110 configured for controlling the switch group 130 according to state information of the battery (B).

The switch group 130 may include a plurality of switches 130-1, 130-2, 130-3, . . . 130-*n* configured to supply or block the electric energy of the battery (B) to the electronic component 30 in response to a power control signal of the controller 110. Each of the plurality of switches 130-1, 130-2, 130-3, . . . 130-*n* may employ a latching relay, a relay, an intelligent power switch (IPS), a bipolar junction transistor (BJT), a photo coupler, a Metal Oxide Silicon Field Effect transistor (MOSFET), an Insulated Gate Bipolar Transistor (IGBT), and a thyristor.

The plurality of switches 130-1, 130-2, 130-3, . . . 130-*n* may be individually provided in each of the plurality of electric components 30 or the plurality of switches 130-1, 130-2, 130-3, ... 130-n may be provided by corresponding the electronic component group 200 in which some of electric components 30 is grouped, as illustrated in FIG. 3.

When the switch 130-1, 130-2, 130-3, ... 130-n is turned on, the electronic component 30 included in the electronic component group 200 corresponding to the switch may receive the power from the battery (B), and when the switch 130-1, 130-2, 130-3, ... 130-n is turned off, the electronic component 30 included in the electronic component group 200 corresponding to the switch may not receive the power from the battery (B). In other words, when the switch 130-1, 130-2, 130-3, ... 130-n is turned off, an operation of the electronic component 30 included in the electronic component group 200 corresponding to the switch may be stopped.

The communicator 120 may include a transceiver 121 configured to transmit a communication signal to the vehicle communication network (CNT) and receive a communication signal from the vehicle communication network (CNT).

The transceiver 121 may modulate communication data of the controller 110 into a communication signal and transmit the communication signal to the vehicle communication network (CNT). In addition, the transceiver 121 may receive the communication signal from the vehicle communication network (CNT), demodulate the communication signal into communication data, and output the communication data to the controller 110.

The controller 110 may include a processor 111 configured for generating a control signal to control an operation of the power control apparatus 100 and a memory 112 configured for storing programs and data to control the operation of the power control apparatus 100.

The processor 111 may process the state information of the battery (B) received from the battery state detector 48 according to the programs and data stored in the memory 112, and generate a power control signal configured to turn on or off the plurality of switches 130-1, 130-2, 130-3, ... 130-n included in the switch group 130.

For example, when the vehicle 1 is parked, the processor 111 may determine an amount of charge the battery (B), i.e., quantity of charge stored in the battery (B), from the rated capacity, the state of charge (SoC), the state of health (SoH), and the temperature (t) of the battery (B). To block the power supplied to the electronic component 30 which is continuously operated even when the vehicle 1 is parked, the processor 111 may generate a power control signal to turn on or off the plurality of switches 130-1, 130-2, 130-3, ... 130-n according to the charge amount of the battery (B).

For another example, the processor 111 may determine a rate of change of the state of charge (SoC) per hour from the state of charge (SoC) of the battery (B), and generate a power control signal to turn on or off the plurality of switches 130-1, 130-2, 130-3, ... 130-n according to the rate of change of the state of charge (SoC) per hour.

In the present time, the power control signal may be provided to the plurality of switches 130-1, 130-2, 130-3, ... 130-n included in the switch group 130, and thus the plurality of switches 130-1, 130-2, 130-3, ... 130-n may be turned on or off in response to the power control signal. In addition, the power may be supplied to the plurality of the electronic component groups 200 or the power may be blocked by turning on or off the plurality of switches 130-1, 130-2, 130-3, ... 130-n.

The memory 112 may store programs and data for controlling the operation of the power control apparatus 100 and memory the state information of the battery, e.g., the rated capacity, the state of charge (SoC), the state of health (SoH), the output voltage (V), the temperature (t) and the Real Time clock (RTC) of the battery (B), which are received from the battery state detector 48.

The memory 112 may include a volatile memory, e.g., a Static Random Access Memory (S-RAM) and a Dynamic Random Access Memory (D-RAM), and a nonvolatile memory, e.g., a Read only Memory (ROM), an Erasable Programmable Read Only Memory (EPROM), an Electrically Erasable Programmable Read Only Memory (EEPROM) and a flash memory. The volatile memory may store the state information of the battery, e.g., the rated capacity, the state of charge (SoC), the state of health (SoH), the output voltage (V), the temperature (t) and the Real Time clock (RTC) of the battery (B), and the nonvolatile memory may store the programs and data for controlling the operation of the power control apparatus 100.

The above mentioned processor 111 and memory 112 may be configured as a separate chip or a single chip. For example, a process block and a memory block may be provided in a single chip.

As mentioned above, the controller 110 may turn on or off the plurality of switches 130-1, 130-2, 130-3, ... 130-n included in the switch group 130 according to the state information of the battery (B) received from the battery state detector 48.

The controller 110 may be referred to by various names, e.g., central processing unit (CPU), electronic control unit (ECU), micro controller unit (MCU) or application processor (AP), but is not limited thereto.

Hereinbefore the configuration of the power control apparatus 100 has been described. Hereinafter an operation of the power control apparatus 100 will be described.

Figure 4:
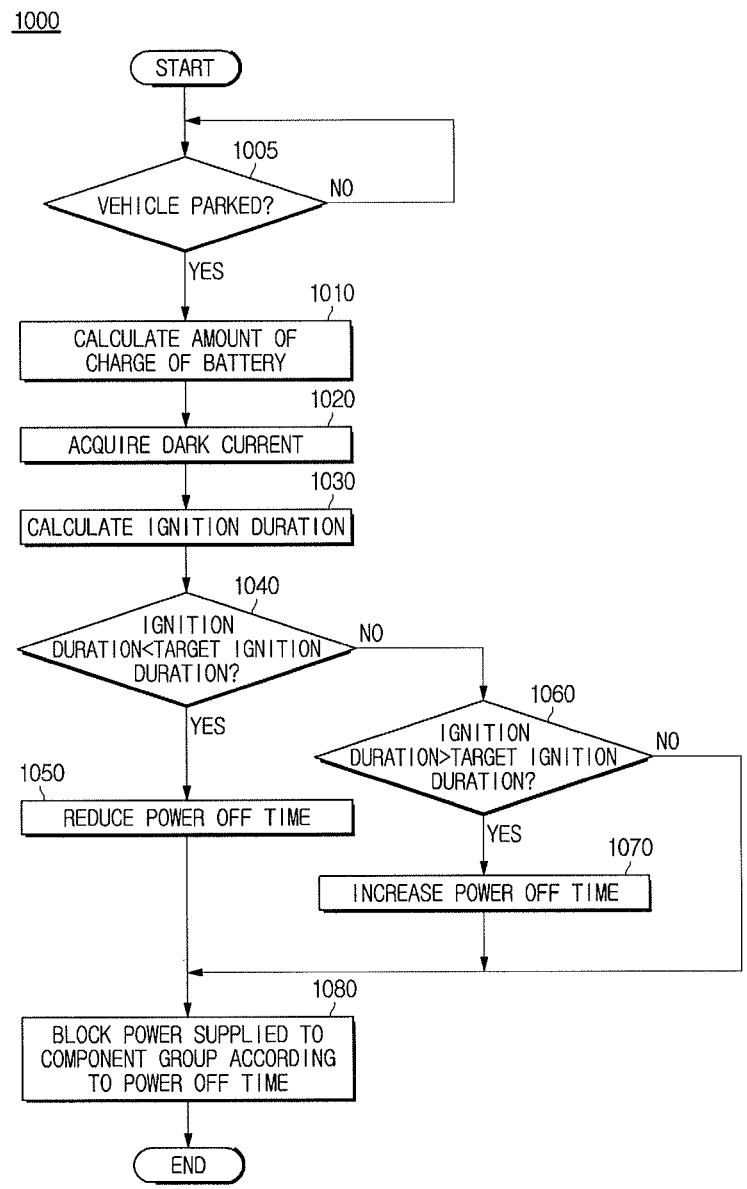
FIG. 4 is a flowchart illustrating an example of a method for blocking the power supplied to the electronic component by the power control apparatus in accordance with an exemplary embodiment of the present invention.
Figure 5:
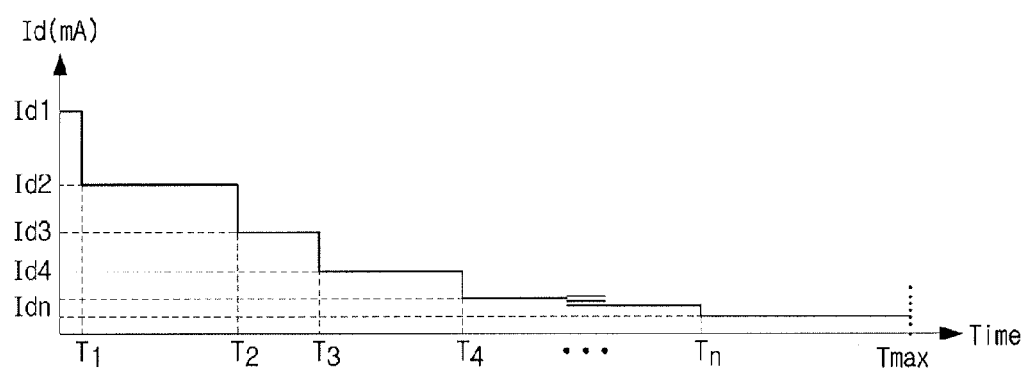
FIG. 5 is a graph illustrating a method for blocking sequentially the power of the electronic component for an ignition duration according to the method shown in FIG. 4.
Figure 6:
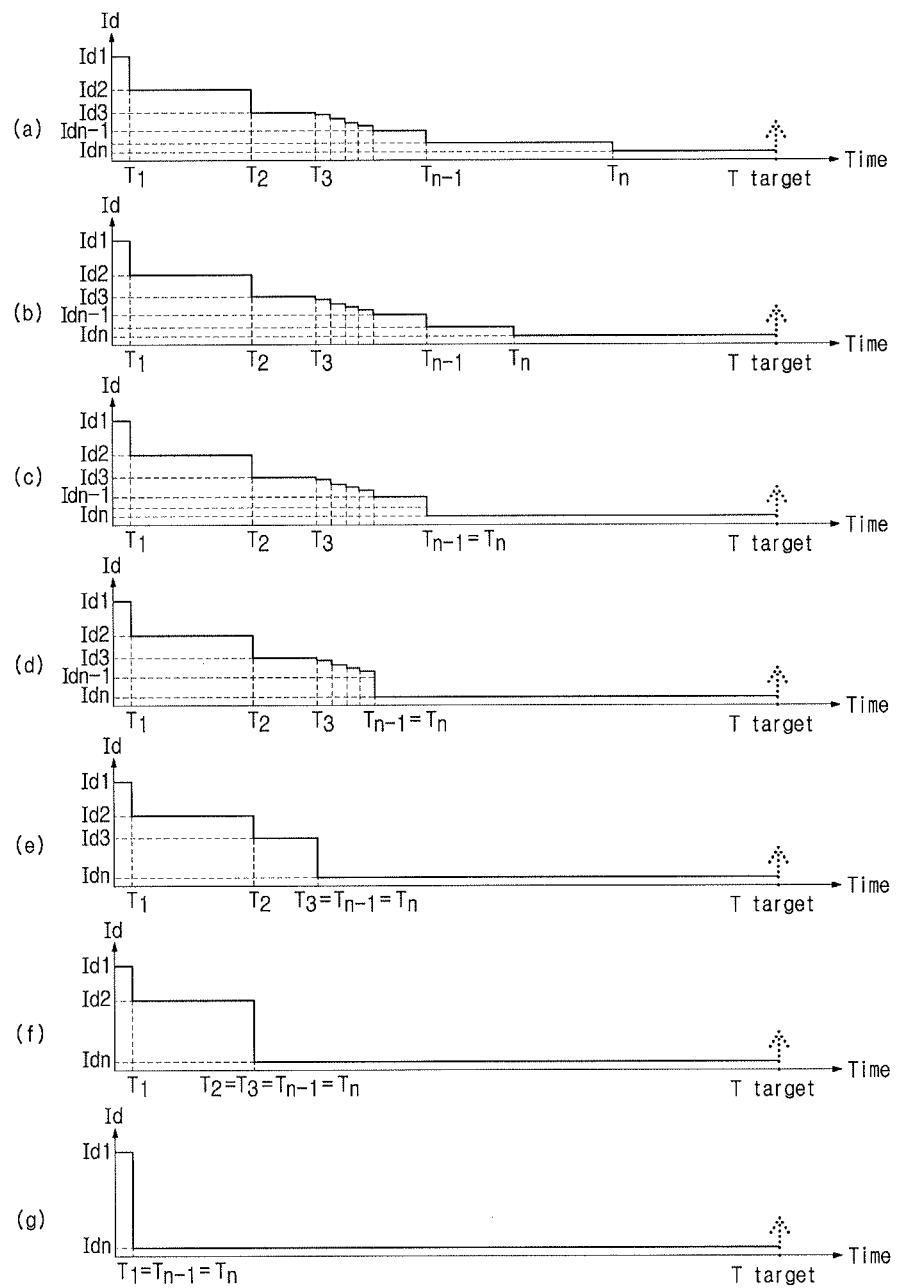
FIG. 6 is a view illustrating an example of changing a power off time of the electronic component group according to the method shown in FIG. 4.
Figure 7:
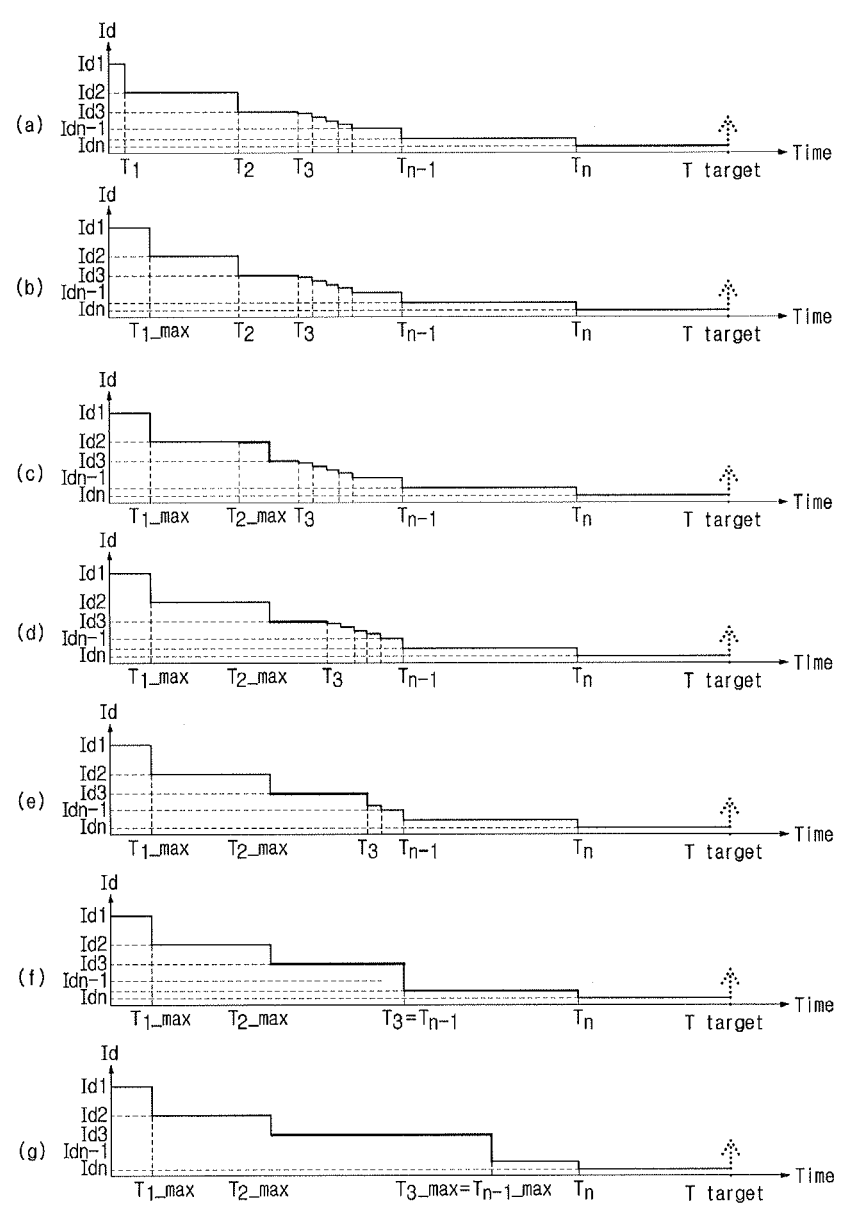
FIG. 7 is a view illustrating another example of changing a power off time of the electronic component group according to the method shown in FIG. 4

FIG. 4 is a flowchart illustrating an example of a method for blocking the power supplied to the electronic component by the power control apparatus in accordance with an exemplary embodiment of the present invention. FIG. 5 is a graph illustrating a method for blocking sequentially the power of the electronic component for an ignition duration according to the method shown in FIG. 4. FIG. 6 is a view illustrating an example of changing a power off time of the electronic component group according to the method shown in FIG. 4. In addition, FIG. 7 is a view illustrating another example of changing a power off time of the electronic component group according to the method shown in FIG. 4.

A method (1000) in which the power control apparatus 100 blocks the power of the electronic component 30 will be described with reference to FIGS. 4 to 7.

The vehicle 1 may determine whether the vehicle 1 is in a parking state (1005).

The power control apparatus 100 may determine whether the vehicle 1 is in the parking state.

For example, when a message indicating that the engine is turned off is received, the power control apparatus 100 may determine that the vehicle 1 is in the parking state. In addition, when a message indicating that a gear lever is changed into the parking state is received and then the message indicating that the engine is turned off is received via the vehicle communication network (CNT), the power control apparatus 100 may determine that the vehicle 1 is in the parking state. In addition, when the message indicating that the engine is turned off and then the message indicating that a door is locked is received via the vehicle communication network (CNT), the power control apparatus 100 may determine that the vehicle 1 is in the parking state.

When the vehicle 1 is parked, YES in 1005, the vehicle 1 may determine an amount of charge (Q) of the battery (B) 1010.

The power control apparatus 100 of the vehicle 1 may receive the battery state information, e.g., the rated capacity ($Q_r$), the state of charge (SoC), the state of health (SoH), the output voltage (V), the temperature (t) and the Real Time clock (RTC) of the battery (B), from the battery state detector 48. For example, the power control apparatus 100 may directly receive the battery state information from the battery state detector 48, or the power control apparatus 100 may receive the battery state information from the battery state detector 48 via the vehicle communication network (CNT).

The controller 110 of the power control apparatus 100 may determine quantity of charge stored in the battery (B), which is a practical amount of charge of the battery (B), from the rated capacity, the state of charge (SoC), the state of health (SoH), and the temperature (t) of the battery (B). The controller 110 may determine an amount of charge of the battery (B) by using equation 1, equation 2, and equation 3 in the following.

In the present time, maximum quantity of charge, which is maximally stored in the battery (B), i.e., a maximum amount of charge ($Q_v$) of the battery (B) may be determined by the state of health (SoH) and the temperature (t) and thus the controller 110 may determine a maximum amount of charge of the battery (B) according to the rated capacity ($Q_r$), the state of health (SoH), and the temperature (t), by using the equation 1.

$$Q_v = Q_r * \left(1 - \frac{(1-SoH)}{100}\right) * \frac{K(t)}{100} \quad \text{Equation 1}$$

$Q_v$ represents a maximum amount of charge of the battery (B), $Q_r$ represents the rated capacity of the battery (B), SoH represents the state of health of the battery (B), and K (t) represents a function representing the battery efficiency according to the temperature of the battery (B).

K (t) may be expressed as the equation 2.

$$K(t) = 0.0000008*t^4 - 0.00003*t^3 - 0.0077*t^2 + 1.0119*t + 79.044 \quad \text{Equation 2}$$

K (t) represents the battery efficiency according to the temperature of the battery (B), and t represent the temperature of the battery (B).

As mentioned above, the controller 110 may determine a maximum amount of charge ($Q_v$) of the battery (B) based on the rated capacity ($Q_r$), the state of health (SoH), and the temperature (t) of the battery (B).

Since the amount of charge (Q) of the battery (B) is proportional to the state of charge (SoC), the controller 110 may determine the amount of charge of the battery (Q) based on the maximum amount of charge ($Q_v$) and the state of charge (SoC) of the battery (B), by using the equation 3.

$$Q = Q_v * \left(\frac{SoC}{100}\right) \quad \text{Equation 3}$$

Q represents the amount of charge of the battery (B), $Q_v$ represents the maximum amount of charge of the battery (B), and SoC represents the state of charge of the battery (B).

As mentioned above, the controller 110 may determine the maximum amount of charge ($Q_v$) of the battery (B) based on the rated capacity ($Q_r$), the state of health (SoH), and the temperature (t) of the battery (B), and determine the amount of charge of the battery (Q) based on the maximum amount of charge ($Q_v$) and the state of charge (SoC) of the battery (B).

The vehicle 1 may determine the size of the dark current 1020.

The power control apparatus 100 of the vehicle 1 may determine the size of the dark current that is consumed by the electronic component 30 when the vehicle 1 is parked.

As mentioned above, when the vehicle 1 is parked, a remaining charge of the battery (B) may be gradually reduced due to the dark current of the electronic component 30, and the power control apparatus 100 may manage the electric energy stored in the battery (B) for the ignition of the vehicle 1.

The power control apparatus 100 may block the power supplied to the plurality of the electronic component groups 200 when the vehicle 1 is parked. For the convenience of a driver who starts the vehicle 1 at any time, the power control apparatus 100 may sequentially block the power by corresponding to the electronic component group 200 without simultaneously blocking the power supplied to all of the electronic component groups 200.

Since the power control apparatus 100 sequentially blocks the power supplied to the plurality of the electronic component groups 200, the dark current ($I_d$) of the vehicle 1 may be sequentially reduced when the vehicle 1 is parked, as illustrated in FIG. 5.

In the present time, a time period until the power supplied to the electronic component group 200 is blocked from the start of parking may be referred to as "power off time". For example, a time period until the power supplied to the first electronic component group 200-1 is blocked from the start of parking may be a first power off time ($T_1$), and a time period until the power supplied to the second electronic component group 200-2 is blocked may be a second power off time ($T_2$). In addition, a time period until the power supplied to the nth electronic component group 200-n is blocked from the start of parking may be the nth power off time ($T_n$).

An initial value of the power off time may be referred to as "reference off time". For example, an initial value of the first power off time ($T_1$) may be a first reference off time ($T_0$), and an initial value of the second power off time ($T_2$) may be a second reference off time ($T_{r2}$). An initial value of the nth power off time ($T_n$) may be a nth reference off time ($T_{rn}$).

Referring to FIG. 5, a first dark current ($I_{d1}$) may be consumed until the first power off time ($T_1$) from the start of parking, and a second dark current ($I_{d2}$) may be consumed until the second power off time ($T_2$) from the first power off time ($T_1$). Further, a nth dark current ($I_{dn}$) may be consumed until the nth power off time ($T_n$) from the n−1th power off time ($T_{n-1}$)

To manage the remaining charge of the battery (B), the power control apparatus 100 may determine the size of the dark current ($I_{d1}$, $I_{d2}$, . . . $I_{dn}$) according to sequentially blocking the power supplied to the electronic component group 200.

For example, the size of the dark current ($I_{d1}$, $I_{d2}$, . . . $I_{dn}$), which is changed according to sequentially blocking the power supplied to the plurality of the electronic component groups 200, may be pre-stored in the memory 112 by a designer of the vehicle 1. A first dark current ($I_{d1}$) indicating the size of the dark current when the power supplied to all of the electronic component group 200 is not blocked, a second dark current ($I_{d2}$) indicating the size of the dark current when the power supplied to the first electronic component group 200-1 is blocked, a third dark current ($I_{d3}$) indicating the size of the dark current when the power supplied to the first electronic component group 200-1 and the second electronic component group 200-2 are blocked, . . . a nth dark current ($I_{dn}$) indicating the size of the dark current when the power supplied to all of the electronic component group 200 is blocked may be stored in the memory 112.

The controller 110 of the power control apparatus 100 may determine the size of the dark current from the memory 112.

For another example, the controller 110 of the power control apparatus 100 may detect the size of the dark current ($I_{d1}$, $I_{d2}$, . . . $I_{dn}$) while sequentially blocking the power supplied to the electronic component group 200. The controller 110 may receive the output current (I) of the battery (B) from the battery state detector 48 while sequentially blocking the power supplied to the electronic component group 200.

The controller 110 may store the output current (I) of the battery (B) according to blocking the power supplied to the electronic component group 200. In the memory 112, the controller 110 may store the first dark current ($I_{d1}$) indicating the output current (I) when the power supplied to all of the electronic component group 200 is not blocked, the second dark current ($I_{d2}$) indicating the output current (I) when the power supplied to the first electronic component group 200-1 is blocked, the third dark current ($I_{d3}$) indicating the output current (I) when the power supplied to the first electronic component group 200-1 and the second electronic component group 200-2 are blocked, . . . the nth dark current ($I_{dn}$) indicating the output current (I) when the power supplied to all of the electronic component group 200 is blocked.

As mentioned above, the controller 110 may determine the dark current ($I_{d1}$, $I_{d2}$, . . . $I_{dn}$) according to sequentially blocking the power supplied to the electronic component group 200.

The vehicle 1 may determine an ignition duration (1030).

"Ignition duration ($T_{max}$)" may represent a time period when the battery (B) practically maintains an amount of charge that is equal to or more than a required amount of charge for ignition ($Q_{ign}$), when the vehicle 1 is parked. In addition, "required amount of charge for ignition ($Q_{ign}$)" may represent an amount of charge required for the ignition of the vehicle 1. In other words, when the remaining charge of the battery (B) is more than the required amount of charge for ignition ($Q_{ign}$), it may be possible to start the vehicle 1. For example, when the ignition duration is 180 days and the required amount of charge for ignition ($Q_{ign}$) is 63 Ahr, the battery (B) may maintain the remaining charge of the battery (B) as 63 Ahr during 180 days from when the parking of the vehicle 1 is started.

Since the power control apparatus 100 sequentially blocks the power supplied to the plurality of the electronic component groups 200, the dark current ($I_d$) of the vehicle 1 may be sequentially reduced during the parking, as illustrated in FIG. 5. The power control apparatus 100 may determine the ignition duration of the vehicle 1 based on the dark current ($I_{d1}$, $I_{d2}$, . . . $I_{dn}$) according to blocking sequentially the power supplied to the electronic component group 200 and the reference off time ($T_{r1}$, $T_{r2}$, . . . $T_{rn}$).

An area of a lower portion of the graph of FIG. 5 illustrating the dark current ($I_d$) may represent the power that is consumed by the dark current ($I_d$) when the vehicle 1 is parked, i.e., a consumption of the battery (B). In the present time, the area of the lower portion of the graph of FIG. 5 may be an amount of the power that is consumed by the electronic component 30 for the ignition duration ($T_{max}$). In other words, a difference between the amount of charge (Q) of the battery (B) when the parking of the vehicle is started, and the consumed amount of power for the ignition duration ($T_{max}$) may be the same as the required amount of charge for ignition ($Q_{ign}$).

In other words, the required amount of charge for ignition ($Q_{ign}$), the dark current ($I_{d1}$, $I_{d2}$, . . . $I_{dn}$), and the reference off time ($T_{r1}$, $T_{r2}$, $T_{rn}$) may have a relationship as equation 4.

$$Q_{ign}=Q-(I_{d1}*(T_{r1}-0))-(I_{d2}*(T_{r2}-T_{r1})) \ldots -(I_{dn}*(T_{max}-T_{rn})) \quad \text{Equation 4}$$

$Q_{ign}$ represents the required amount of charge for ignition, Q represents the amount of charge of the battery (B) when the parking is started, $I_{d1}$ represents the size of the dark current before the power supplied to the electronic component group is blocked, $T_{r1}$ represents the reference off time of the first electronic component group, $I_{d2}$ represents the size of the dark current when the power supplied to the first electronic component group is blocked, $T_{r2}$ represents the reference off time of the second electronic component group, $I_{dn}$ represents the size of the dark current when the power supplied to all of the electronic component group is blocked, $T_{rn}$ represents the reference off time of the nth electronic component group, and $T_{max}$ represents the ignition duration.

The power control apparatus 100 may determine the ignition duration ($T_{max}$) by using the equation 4.

The vehicle 1 may determine whether the ignition duration ($T_{max}$) is less than a target ignition duration ($T_{target}$) (1040).

"Target ignition duration ($T_{target}$)" may represent a time period until a next ignition time from the start of parking, in a state in which the vehicle 1 is parked. In other words, the target ignition duration ($T_{target}$) may represent a time period when the vehicle 1 is parked. The target ignition duration ($T_{target}$) may be predetermined by a designer of the vehicle 1 or may be set by a driver. For example, when the vehicle 1 is sold and then delivered to a driver, the target ignition duration ($T_{target}$) may be set in consideration of times, e.g., a shipment and a delivery. In addition, when a driver parks the vehicle 1 for a long time due to any reason, e.g. a trip, the driver may set the target ignition duration ($T_{target}$) in consideration of a schedule.

The controller 110 of the power control apparatus 100 may compare the ignition duration ($T_{max}$), which is determined by using the equation 4, with the target ignition duration ($T_{target}$), and determine whether the ignition duration ($T_{max}$) is less than the target ignition duration ($T_{target}$).

When the ignition duration ($T_{max}$) is less than the target ignition duration ($T_{target}$), YES in 1040, the vehicle 1 may reduce the power off time ($T_1$, $T_2$, . . . $T_n$) (1050).

When the ignition duration ($T_{max}$) is less than the target ignition duration ($T_{target}$), it may be impossible for a driver to start the vehicle 1 on a day when the driver wants to start the vehicle 1. Therefore, the power control apparatus 100 may reduce the power off time ($T_1$, $T_2$, . . . $T_n$) to reduce the dark current ($I_d$) that is consumed during the parking. In other words, during parking, the power control apparatus 100 may block the power which is supplied faster to the plurality of the electronic component groups 200 than the reference off time ($T_{r1}$, $T_{r2}$, . . . $T_{rn}$).

For example, as illustrated in FIG. 6, the power control apparatus 100 may sequentially reduce the power off time ($T_1$, $T_2$, . . . $T_n$) in a reverse order compared with an order in which the power is blocked.

As illustrated in FIG. 6A and FIG. 6B the power control apparatus 100 may firstly reduce the nth power off time ($T_n$) of the nth electronic component group 200-$n$ to which the power is most recently supplied. The power control apparatus 100 may reduce the nth power off time ($T_n$) of the nth electronic component group 200-$n$ to the n–1th power off time ($T_{n-1}$) of the n–1th electronic component group 200-$n$–1.

As illustrated in FIG. 6C, when the nth power off time ($T_n$) of the nth electronic component group 200-$n$ is equal to the n–1th power off time ($T_{n-1}$) of the n–1th electronic component group 200-$n$–1, the power control apparatus 100 may simultaneously reduce the nth power off time ($T_n$) of the nth electronic component group 200-$n$ and the n–1th power off time ($T_{n-1}$) of the n–1th electronic component group 200-$n$–1, as illustrated in FIG. 6D.

As illustrated in FIG. 6E, when the nth power off time ($T_n$) of the nth electronic component group 200-$n$ is equal to the third power off time ($T_3$) of the third electronic component group 200-3, the power control apparatus 100 may simultaneously reduce the nth power off time ($T_n$) of the nth electronic component group 200-$n$, the n–1th power off time ($T_{n-1}$) of the n–1th electronic component group 200-$n$–1, . . . the third power off time ($T_3$) of the third electronic component group 200-3, to the second power off time ($T_2$) of the second electronic component group 200-2, as illustrated in FIG. 6F.

When the nth power off time ($T_n$) of the nth electronic component group 200-$n$ is equal to the second power off time ($T_2$) of the second electronic component group 200-2, the power control apparatus 100 may reduce the nth power off time ($T_n$) of the nth electronic component group 200-$n$, the n–1th power off time ($T_{n-1}$) of the n–1th electronic component group 200-$n$–1, . . . the third power off time ($T_3$) of the third electronic component group 200-3, and the second power off time ($T_2$) of the second electronic component group 200-2, to the first power off time ($T_1$) of the first electronic component group 200-1, as illustrated in FIG. 6G.

A method for reducing the power off time ($T_1$, $T_2$, . . . $T_n$) is not limited to the method shown in FIG. 6. For example, the power control apparatus 100 may sequentially reduce the power off time ($T_1$, $T_2$, . . . $T_n$) in an order that is the same as the order in which the power is blocked.

When the ignition duration ($T_{max}$) is not less than the target ignition duration ($T_{target}$), (NO in 1040), the vehicle 1 may determine whether the ignition duration ($T_{max}$) is larger than the target ignition duration ($T_{target}$) (1060).

The controller 110 of the power control apparatus 100 may compare the ignition duration ($T_{max}$), which is determined by using equation 4, with the target ignition duration ($T_{target}$), and determine whether the ignition duration ($T_{max}$) is larger than the target ignition duration ($T_{target}$).

When the ignition duration ($T_{max}$) is larger than the target ignition duration ($T_{target}$) (YES in 1060), the vehicle 1 may increase the power off time ($T_1$, $T_2$, . . . $T_n$) (1070).

When the ignition duration ($T_{max}$) is larger than the target ignition duration ($T_{target}$), it may be possible for a driver to sufficiently start the vehicle 1 on a day when the driver wants to start the vehicle 1, and further the battery (B) may have a larger remaining charge than the required amount of charge for ignition ($Q_{ign}$).

To improve the convenience of a driver who uses the vehicle before the target ignition duration ($T_{target}$) is expired, the power control apparatus 100 may increase the power off time ($T_1$, $T_2$, . . . $T_n$) to reduce the dark current ($I_d$) which is consumed during parking. In other words, during parking, the power control apparatus 100 may block the power which is supplied slower to the plurality of the electronic component groups 200 than the reference off time ($T_{r1}$, $T_{r2}$, . . . $T_{rn}$).

For example, as illustrated in FIG. 7, the power control apparatus 100 may sequentially increase the power off time ($T_1$, $T_2$, . . . $T_n$) in an order that is the same as the order in which the power is blocked.

As illustrated in FIG. 7A and FIG. 7B, the power control apparatus 100 may firstly increase the first power off time ($T_1$) of the first electronic component group 200-1 to which the power is firstly supplied. The power control apparatus 100 may increase the first power off time ($T_1$) of the first electronic component group 200-1 to a maximum first power off time ($T_{1\_max}$).

As illustrated in FIG. 7C, the power control apparatus 100 may increase the second power off time ($T_2$) of the second electronic component group 200-2 to a maximum second power off time ($T_{2\_max}$).

As illustrated in FIG. 7D through FIG. 7F, the power control apparatus 100 may increase the third power off time ($T_3$) of the third electronic component group 200-3 to the n–1th power off time ($T_{n-1}$) of the n–1th electronic component group 200-$n$–1.

As illustrated in FIG. 7G, the power control apparatus 100 may increase the third power off time ($T_3$) of the third electronic component group 200-3 and the n–1th power off time ($T_{n-1}$) of the n–1th electronic component group 200-$n$–1 to a maximum n–1th power off time ($T_{n-1\_max}$).

A method for increasing the power off time ($T_1$, $T_2$, . . . $T_n$) is not limited to the method shown in FIG. 7. For example, the power control apparatus 100 may sequentially increase the power off time ($T_1$, $T_2$, . . . $T_n$) in a reverse order of the order in which the power is blocked.

When the ignition duration ($T_{max}$) is not larger than the target ignition duration ($T_{target}$) (NO in 1060), the vehicle 1 may block the power supplied to the plurality of the electronic component groups 200 according to the power off time ($T_1$, $T_2$, . . . $T_n$) (1080).

When the ignition duration ($T_{max}$) is neither larger nor less than the target ignition duration ($T_{target}$), the power control apparatus 100 may determine that the ignition duration ($T_{max}$) is equal to the target ignition duration ($T_{target}$). In other words, the battery (B) of the vehicle 1 may maintain the required amount of charge for ignition ($Q_{ign}$) until the target ignition duration ($T_{target}$).

Accordingly, the power control apparatus 100 may sequentially block the power supplied to the plurality of the electronic component groups 200 according to the power off time. For example, when the first power off time ($T_1$) is expired after the start of the parking of the vehicle 1, the controller 110 of the power control apparatus 100 may output an off signal to a first switch 130-1 to block the power supplied to the first electronic component group 200-1. In addition, when the second power off time ($T_2$) is expired after the start of the parking of the vehicle 1, the controller 110 of the power control apparatus 100 may output an off signal to a second switch 130-2 to block the power supplied to the second electronic component group 200-2. When the nth power off time ($T_n$) is expired after the start of the parking of the vehicle 1, the controller 110 of the power control apparatus 100 may output an off signal to a nth switch 130-$n$ to block the power supplied to the nth electronic component group 200-$n$.

As mentioned above, the controller 110 may sequentially output the off signal to the plurality of switches 130-1, 130-2, 130-3, . . . 130-$n$ so that the power supplied to the plurality of the electronic component group 200 may be sequentially blocked.

Accordingly, the power control apparatus 100 may maintain the function of the vehicle 1 at the most during parking, and maintain the remaining charge of the battery (B) until target ignition duration ($T_{target}$) is expired for the ignition of the vehicle 1.

Hereinbefore the power control apparatus 100 has determined the power off time ($T_1$, $T_2$, . . . $T_n$) based on the amount of charge (Q) of the battery (B), but is not limited thereto.

Hereinafter another method for determining the power off time ($T_1$, $T_2$, . . . $T_n$) will be described.

Figure 8:
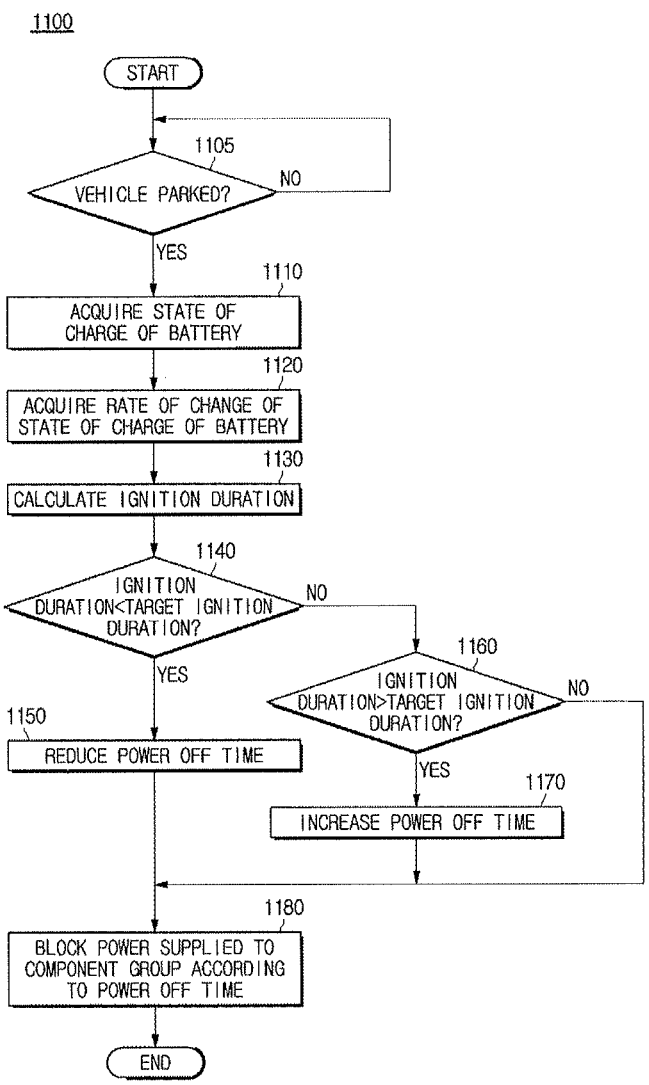
FIG. 8 is a flowchart illustrating another example of a method for blocking the power of the electronic component by the power control apparatus in accordance with an exemplary embodiment of the present invention.
Figure 9:
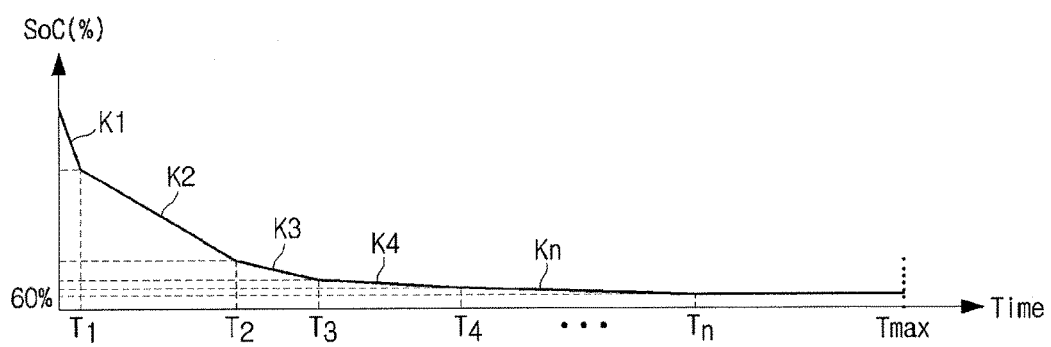
FIG. 9 is a graph illustrating a method for blocking sequentially the power of the electronic component for the ignition duration according to the method shown in FIG. 8.

FIG. 8 is a flowchart illustrating another example of a method for blocking the power of the electronic component by the power control apparatus in accordance with an exemplary embodiment of the present invention. FIG. 9 is a graph illustrating a method for blocking sequentially the power of the electronic component for the ignition duration according to the method shown in FIG. 8.

A method (1100) in which the power control apparatus 100 blocks the power of the electronic component 30 will be described with reference to FIG. 8 and FIG. 9.

The vehicle 1 may determine whether the vehicle 1 is in a parking state (1105).

The power control apparatus 100 may determine whether the vehicle 1 is in the parking state.

For example, when a message indicating that the engine is turned off is received, the power control apparatus 100 may determine that the vehicle 1 is in the parking state.

When the vehicle 1 is in the parking state (YES in 1105), the vehicle 1 may acquire the state of charge (SoC) of the battery (B) (1110).

The power control apparatus 100 of the vehicle 1 may receive the state of charge (SoC) of the battery (B) from the battery state detector 48. For example, the power control apparatus 100 may directly receive the state of charge (SoC) from the battery state detector 48, or the power control apparatus 100 may receive the state of charge (SoC) from the battery state detector 48 via the vehicle communication network (CNT).

The vehicle 1 may acquire a rate of change of the state of charge (SoC) of the battery (B) (1120).

When the vehicle 1 is parked, the state of charge (SoC) of the battery (B) may be gradually reduced due to the dark current that is consumed by the electronic component 30.

As mentioned above, the power control apparatus 100 may block the power supplied to the plurality of the electronic component groups 200 to manage the remaining charge of the battery (B) when the vehicle 1 is parked. For the convenience of a driver who turns on an ignition of the vehicle 1 at any time, the power control apparatus 100 may sequentially block the power by corresponding to the electronic component group 200 without simultaneously blocking the power supplied to the entire electronic component group 200.

Since the power control apparatus 100 sequentially blocks the power supplied to the plurality of the electronic component groups 200, the state of charge (SoC) of the battery (B) may be gradually reduced, as illustrated in FIG. 9.

At the present time, a time period until the power supplied to the electronic component group 200 is blocked from the start of the parking may be referred to as the first, the second, . . . the nth power-off time (T 1, T 2, . . . T n), and an initial value of the first, the second, . . . the nth power-off time (T 1, T 2, . . . T n) may be referred to as the first, second, . . . the nth reference off time (T r1, T r2, . . . T rn).

Referring to FIG. 9, a rate of change of the state of charge (SoC) until the first power off time (T 1) from the start of the parking may be a first rate of change ($k_1$) and a rate of change of the state of charge (SoC) until the second power off time (T 2) from the first power off time (T 1) may be a second rate of change ($k_2$). Further, a rate of change of the state of charge (SoC) until the nth power off time (T n) from the n−1th power off time ($T_n$−1) may be a nth rate of change ($k_n$).

To manage the remaining charge of the battery (B), the power control apparatus 100 may determine the rate of change ($k_1$, $k_2$, . . . $k_n$) of the state of charge (SoC) of the battery (B) according to sequentially blocking the power supplied to the electronic component group 200.

For example, the rate of change ($k_1$, $k_2$, . . . $k_n$) of the state of charge (SoC) of the battery (B), which is changed according to sequentially blocking the power supplied to the electronic component group 200, may be pre-stored in the memory 112 by a designer of the vehicle 1.

The controller 110 of the power control apparatus 100 may determine the size of the dark current from the memory 112.

For another example, the controller 110 of the power control apparatus 100 may determine the rate of change ($k_1$, $k_2$, . . . $k_n$) of the state of charge (SoC) of the battery (B) while sequentially blocking the power supplied to the electronic component group 200. The controller 110 may receive the state of charge (SoC) of the battery (B) from the battery state detector 48 while sequentially blocking the power supplied to the electronic component group 200 and determine the rate of change ($k_1$, $k_2$, . . . $k_n$) of the state of charge (SoC).

The controller 110 may store the output current (I) of the battery (B), which is changed according to sequentially blocking the power supplied to the electronic component group 200, in the memory 112.

As mentioned above, the controller 110 may acquire the rate of change ($k_1$, $k_2$, . . . $k_n$) of the state of charge (SoC) according to sequentially blocking the power supplied to the electronic component group 200.

The vehicle 1 may determine the ignition duration ($T_{max}$) (1130).

"Ignition duration ($T_{max}$)" may represent a time period when the battery (B) practically maintains an amount of charge that is equal to or more than an ignition required state of charge ($SoC_{ign}$), when the vehicle 1 is parked. In addition, "required state of charge for ignition ($SoC_{ign}$)" may represent the state of charge required for the ignition of the vehicle 1. Although the required state of charge for ignition ($SoC_{ign}$) varies according to the type of the vehicle, it has been known that required state of charge for ignition ($SoC_{ign}$) is approximately 60%.

Since the power control apparatus 100 sequentially blocks the power supplied to the plurality of the electronic component groups 200, the state of charge (SoC) of the battery (B) may be sequentially reduced during parking, as illustrated in FIG. 9. The power control apparatus 100 may determine the ignition duration of the vehicle 1 based on the rate of change ($k_1$, $k_2$, . . . $k_n$) of the state of charge (SoC) according to sequentially blocking the power supplied to the electronic component group 200 and the reference off time ($T_{r1}$, $T_{r2}$, . . . $T_{rn}$).

The state of charge (SoC) of the battery (B) about a time may be expressed by a plurality of linear equations, as shown by equation 5.

$$Y_1(t) = k_1 * t + SoC(0), \qquad 0 < t < T_1 \qquad \text{Equation 5}$$
$$Y_2(t) = k_2 * (t - T_1) + Y_1(T_1), \qquad T_1 < t < T_2$$
$$Y_3(t) = k_3 * (t - T_2) + Y_2(T_2), \qquad T_2 < t < T_3$$
$$\ldots$$
$$Y_n(t) = k_n * (t - T_{n-1}) + Y_{n-1}(T_{n-1}), \quad T_{n-1} < t < T_n$$

$Y_1(t)$ represents a variation of the state of charge (SoC) until the first power off time, $k_1$ represents the first rate of change of the state of charge (SoC), and $T_1$ represents the first power off time. $Y_2(t)$ represents a variation of the state of charge (SoC) from the first power off time to the second power off time, $k_2$ represents the second rate of change of the state of charge (SoC), and $T_2$ represents the second power off time. Further, $Y_n(t)$ represents a variation of the state of charge (SoC) from the n−1th power off time to the nth power off time, $k_n$ represents the nth rate of change of the state of charge (SoC), and $T_n$ represents the nth power off time.

The ignition duration ($T_{max}$) may represent a time period when the battery (B) practically maintains an amount of charge that is equal to or more than the ignition required state of charge ($SoC_{ign}$), when the vehicle 1 is parked, and thus the ignition duration ($T_{max}$) and the rate of charge (SoC) may have the required state of charge for ignition ($SoC_{ign}$), i.e., "60".

Therefore, the power control apparatus 100 may determine a time period when the rate of charge (SoC) becomes "60", as the ignition duration ($T_{max}$), by using equation 5.

The vehicle 1 may determine whether the ignition duration ($T_{max}$) is less than a target ignition duration ($T_{target}$) (1140).

"Target ignition duration ($T_{target}$)" may represent a time period until a next ignition time from the start of the parking of the vehicle 1. In other words, the target ignition duration ($T_{target}$) may represent a time period when the vehicle 1 is parked.

The controller 110 of the power control apparatus 100 may compare the ignition duration ($T_{max}$), which is determined by using equation 5, with the target ignition duration ($T_{target}$), and determine whether the ignition duration ($T_{max}$) is less than the target ignition duration ($T_{target}$).

When the ignition duration ($T_{max}$) is less than the target ignition duration ($T_{target}$) (YES in 1140), the vehicle 1 may reduce the power off time ($T_1, T_2, \ldots T_n$) (1150).

When the ignition duration ($T_{max}$) is less than the target ignition duration ($T_{target}$), it may be impossible for a driver to start the vehicle 1 on a day when the driver wants to start the vehicle 1. Therefore, the power control apparatus 100 may reduce the power off time ($T_1, T_2, \ldots T_n$) to reduce the dark current ($I_d$) that is consumed when parked. A detailed method may be the same as the method shown in FIG. 6.

When the ignition duration ($T_{max}$) is not less than the target ignition duration ($T_{target}$) (NO in 1140), the vehicle 1 may determine whether the ignition duration ($T_{max}$) is larger than the target ignition duration ($T_{target}$) (1160).

The controller 110 of the power control apparatus 100 may compare the ignition duration ($T_{max}$), which is determined by using equation 5, with the target ignition duration ($T_{target}$), and determine whether the ignition duration ($T_{max}$) is larger than the target ignition duration ($T_{target}$).

When the ignition duration ($T_{max}$) is larger than the target ignition duration ($T_{target}$) (YES in 1160), the vehicle 1 may increase the power off time ($T_1, T_2, \ldots T_n$) (1170).

When the ignition duration ($T_{max}$) is larger than the target ignition duration ($T_{target}$), it may be possible for a driver to sufficiently start the vehicle 1 on a day when the driver wants to start the vehicle 1, and further the battery (B) may have a larger remaining charge than the required amount of charge for ignition ($Q_{ign}$).

To improve the convenience of a driver who uses the vehicle before the target ignition duration ($T_{target}$) is expired, the power control apparatus 100 may increase the power off time ($T_1, T_2, \ldots T_n$) to reduce the dark current ($I_d$) which is consumed during the parking. A detailed method may be the same as the method shown in FIG. 7.

When the ignition duration ($T_{max}$) is not larger than the target ignition duration ($T_{target}$) (NO in 1160), the vehicle 1 may block the power supplied to the plurality of the electronic component groups 200 according to the power off time ($T_1, T_2, \ldots T_n$) (1180).

When the ignition duration ($T_{max}$) is neither larger nor less than the target ignition duration ($T_{target}$), the power control apparatus 100 may determine that the ignition duration ($T_{max}$) is equal to the target ignition duration ($T_{target}$). In other words, the battery (B) of the vehicle 1 may maintain the required amount of charge for ignition ($Q_{ign}$) until the target ignition duration ($T_{target}$) is expired.

Therefore, the power control apparatus 100 may sequentially block the power supplied to the plurality of the electronic component groups 200 according to the set power off time.

As mentioned above, the controller 110 may sequentially output the off signal to the plurality of switches 130-1, 130-2, 130-3, . . . 130-n so that the power supplied to the plurality of the electronic component group 200 may be sequentially blocked.

As is apparent from the above description, according to the proposed vehicle, control method thereof and power control apparatus for vehicle, it may be possible to prevent a deep discharge of a battery during parking of the vehicle and provide the convenience to a driver when starting the vehicle.

In addition, it may be possible to secure an ignition of the vehicle for a predetermined target ignition duration during the parking of the vehicle, and allow electronic components of the vehicle to be operated although a driver starts the vehicle before the target ignition duration is expired.

Although various embodiments of the present invention have been shown and described, it would be appreciated by those skilled in the art that changes may be made in these embodiments without departing from the principles and spirit of the disclosure, the scope of which is defined in the claims and their equivalents.

Exemplary embodiments of the present invention have been described above. In the exemplary embodiments described above, some components may be implemented as a "module". Here, the term 'module' means, but is not limited to, a software and/or hardware component including a Field Programmable Gate Array (FPGA) or Application Specific Integrated Circuit (ASIC), which performs certain tasks. A module may advantageously be configured to reside on the addressable storage medium and configured to execute on one or more processors.

Thus, a module may include, by way of example, components including software components, object-oriented software components, class components and task components, processes, functions, attributes, procedures, subroutines, segments of program code, drivers, firmware, microcode, circuitry, data, databases, data structures, tables, arrays, and variables. The operations provided for in the components and modules may be combined into fewer components and modules or further separated into additional components and modules. In addition, the components and modules may be implemented such that they execute one or more CPUs in a device.

With that being said, and in addition to the above described exemplary embodiments, embodiments can thus be implemented through computer readable code/instructions in/on a medium, e.g., a computer readable medium, to control at least one processing element to implement any above described exemplary embodiment. The medium can correspond to any medium/media permitting the storing and/or transmission of the computer readable code.

The computer-readable code can be recorded on a medium or transmitted through the Internet. The medium may include Read Only Memory (ROM), Random Access Memory (RAM), Compact Disk-Read Only Memories (CD-ROMs), magnetic tapes, floppy disks, and optical recording medium. Also, the medium may be a non-transitory computer-readable medium. The media may also be a distributed network, so that the computer readable code is stored or transferred and executed in a distributed fashion. Still further, as only an example, the processing element could include at least one processor or at least one computer processor, and processing elements may be distributed and/or included in a single device.

For convenience in explanation and accurate definition in the appended claims, the terms "upper", "lower", "internal" and "outer", "up", "down", "upper", "lower", "upwards", "downwards", "front", "rear", "back", "inside", "outside", "inwardly", "outwardly", "internal", "external", "forwards" and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A vehicle comprising:
    a battery configured to store electric energy;
    a plurality of electronic components configured to consume the electric energy; and
    a power control apparatus configured to block sequentially power supplied from the battery to the plurality of electronic components, during the vehicle is parked,
    wherein the power control apparatus controls a plurality of power off times configured to block the power supplied to the plurality of electronic components, based on state information of the battery, and the power control apparatus acquires a size of a dark current output from the battery while sequentially blocking the power supplied to the plurality of electronic components.

2. The vehicle of claim 1, wherein
    the battery includes a battery state detector configured to detect a rated capacity and a state of charge of the battery and to transmit the state information of the battery including the rated capacity and the state of charge of the battery, to the power control apparatus.

3. The vehicle of claim 2, wherein
    the power control apparatus is configured to determine an amount of charge of the battery based on the rated capacity and the state of charge of the battery, and controls the plurality of power off times based on the amount of charge of the battery.

4. The vehicle of claim 3, wherein
    the power control apparatus is configured to determine a maximum ignition duration based on the amount of charge of the battery, the size of the dark current and the plurality of power off times, and controls the plurality of power off times based on a result of a comparison between a maximum ignition duration and a predetermined target ignition duration.

5. The vehicle of claim 4, wherein
    the power control apparatus reduces the plurality of power off times when the maximum ignition duration is less than the predetermined target ignition duration.

6. The vehicle of claim 4, wherein
    the power control apparatus increases the plurality of power off times when the maximum ignition duration is larger than the predetermined target ignition duration.

7. A vehicle comprising:
    a battery configured to store electric energy;
    a plurality of electronic components configured to consume the electric energy;
    a power control apparatus configured to block sequentially power supplied from the battery to the plurality of electronic components during a vehicle is parked,
    wherein the power control apparatus adjust a plurality of power off times configured to block the power supplied to the plurality of electronic components, based on state information of the battery,
    wherein the battery includes a battery state detector configured to detect a state of charge of the battery and to transmit the state information of the battery including the state of charge of the battery, to the power control apparatus, and
    wherein the power control apparatus determines a rate of change of the state of charge of the battery while sequentially blocking the power supplied to the plurality of electronic components and the power control apparatus determines a maximum ignition duration based on the state of charge of the battery, the rate of change of the state of charge of the battery and the plurality of power off times, and adjusts the plurality of power off times based on a result of a comparison between the maximum ignition duration and a predetermined target ignition duration.

8. A control method of vehicle comprising:
    detecting a rated capacity and a state of charge of a battery for the vehicle when the vehicle is parked;
    determining an amount of charge of the battery base on the rated capacity and the state of charge of the battery;
    regulating a plurality of power off times configured to block a power supplied to a plurality of electronic components included in the vehicle, based on an amount of charge of the battery; and
    acquiring the size of the dark current output from the battery while sequentially blocking the power supplied to the plurality of electronic components.

9. The control method of claim 8, wherein
    the regulation of the plurality of power off times comprises determining a maximum ignition duration based on an amount of the charge of the battery, a size of the dark current and the plurality of power off times, and regulating the plurality of power off times based on a result of a comparison between a maximum ignition duration and a predetermined target ignition duration.

10. The control method of claim 9, wherein
the regulation of the plurality of power off times based on the result of the comparison between the maximum ignition duration and the predetermined target ignition duration comprises reducing the plurality of power off times when the maximum ignition duration is less than the predetermined target ignition duration.

11. The control method of claim 9, wherein
the regulation of the plurality of power off times based on the result of the comparison between the maximum ignition duration and the predetermined target ignition duration comprises increasing the plurality of power off times when the maximum ignition duration is larger than the predetermined target ignition duration.

12. A power control apparatus comprising:
a plurality of switches configured to control power supplied from a battery to a plurality of electronic components; and
a controller configured to control the plurality of switches wherein the plurality of switches sequentially blocks the power supplied to the plurality of electronic components, during a vehicle is parked,
wherein the controller controls a plurality of power off times configured to block the power supplied to the plurality of electronic components, based on a rated capacity and a state of charge of the battery and the controller determines an amount of charge of the battery based on the rated capacity and the state of charge of the battery, and acquires the size of the dark current output from the battery while sequentially blocking the power supplied to the plurality of electronic components.

13. The power control apparatus of claim 12, wherein
the controller is configured to determine a maximum ignition duration based on the amount of the charge of the battery, the size of the dark current and the plurality of power off times, and controls the plurality of power off times based on a result of a comparison between the maximum ignition duration and a predetermined target ignition duration.

14. The power control apparatus of claim 13, wherein
the controller reduces the plurality of power off times when the maximum ignition duration is less than the predetermined target ignition duration.

15. The power control apparatus of claim 13, wherein
the controller increases the plurality of power off times when the maximum ignition duration is larger than the predetermined target ignition duration.

* * * * *